United States Patent
Tolentino et al.

(10) Patent No.: US 11,626,677 B2
(45) Date of Patent: Apr. 11, 2023

(54) BONDING MODULE PINS TO AN ELECTRONIC SUBSTRATE

(71) Applicant: SEMICONDUCTOR COMPONENTS INDUSTRIES, LLC, Phoenix, AZ (US)

(72) Inventors: Erik Nino Mercado Tolentino, Negeri Sembilan (MY); Dennis Cadiz Yborde, Digos (PH); Shutesh Krishnan, Negeri Sembilan (MY); Pui Leng Low, Rantau (MY)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 206 days.

(21) Appl. No.: 15/931,386

(22) Filed: May 13, 2020

(65) Prior Publication Data

US 2021/0359445 A1    Nov. 18, 2021

(51) Int. Cl.
*H01R 12/70* (2011.01)
*H01R 12/73* (2011.01)
*H01L 23/498* (2006.01)

(52) U.S. Cl.
CPC ........ *H01R 12/73* (2013.01); *H01L 23/49827* (2013.01); *H01L 23/49894* (2013.01)

(58) Field of Classification Search
CPC ........ H01R 12/73; H01R 12/72; H01R 12/71; H01R 12/70; H01R 13/5045; H01R 13/504; H01R 43/02; H01R 43/0207; H01R 43/0221; H01R 43/0249; H01R 43/0256; H01L 23/49827; H01L 23/49894
See application file for complete search history.

(56) References Cited

U.S. PATENT DOCUMENTS

| | | | | |
|---|---|---|---|---|
| 5,746,608 A | * | 5/1998 | Taylor | H05K 7/1084 439/70 |
| 6,997,727 B1 | * | 2/2006 | Legrady | H01R 12/718 439/246 |
| 7,867,016 B2 | * | 1/2011 | Nabilek | H01R 13/6315 439/82 |
| 8,690,586 B2 | * | 4/2014 | Schneider | H01R 12/91 439/66 |
| 9,263,820 B2 | * | 2/2016 | Mattiuzzo | H01R 13/415 |
| 9,590,329 B2 | * | 3/2017 | Mann | H01R 12/58 |
| 9,620,877 B2 | * | 4/2017 | Yao | H01R 43/16 |
| 11,315,859 B1 | * | 4/2022 | Yang | H01L 21/4853 |
| 2010/0167559 A1 | * | 7/2010 | Cavegn | H05K 7/1069 439/65 |

(Continued)

OTHER PUBLICATIONS

Telsonic Ultrasonics, "The Powerhouse of Ultrasonics", saved from URL: https://www.telsonic.com/en/products/ultrasonicweldingsystems-tsp/, May 2020.

(Continued)

*Primary Examiner* — Harshad C Patel
(74) *Attorney, Agent, or Firm* — Brake Hughes Bellermann LLP

(57) ABSTRACT

A method includes disposing a terminal pin on an electronic substrate with a base region of the terminal pin in contact with a circuit trace on an electronic substrate, and ultrasonically coupling the base region of the terminal pin to the circuit trace.

20 Claims, 17 Drawing Sheets

(56) References Cited

U.S. PATENT DOCUMENTS

2012/0295490 A1     11/2012   Schneider
2014/0199861 A1*    7/2014   Mattiuzzo ............ H01R 13/415
                                                                            29/842

OTHER PUBLICATIONS

Azom, "Ultrasonic TORSIONAL Welding—Understanding the Process Benefits, Expanding Applications and Product Design Possibilities", saved from URL: https://www.azom.com/article.aspx?ArticleID=12022, May 22, 2015.

Kulicke & Soffa Industries, Inc. "Latest Ultrasonic Interconnect Technology Solutions", saved from URL: 3. https://www.kns.com/Products/Equipment/Wedge-Bonder/Asterion-UW, Jan. 2020.

J. Tsujino et al., "Ultrasonic complex vibration welding system using 100 kHz one-dimensional longitudinal-torsional vibration converter," 2000 IEEE Ultrasonics Symposium. Proceedings. An International Symposium (Cat. No. 00CH37121), San Juan, Puerto Rico, USA, 2000, pp. 695-698 vol. 1.

L. Zhili et al., "Vibration Simulation of Transducer System in Thermosonic Wire bonding," 2005 Conference on High Density Microsystem Design and Packaging and Component Failure Analysis, Shanghai, 2005, pp. 1-7.

\* cited by examiner

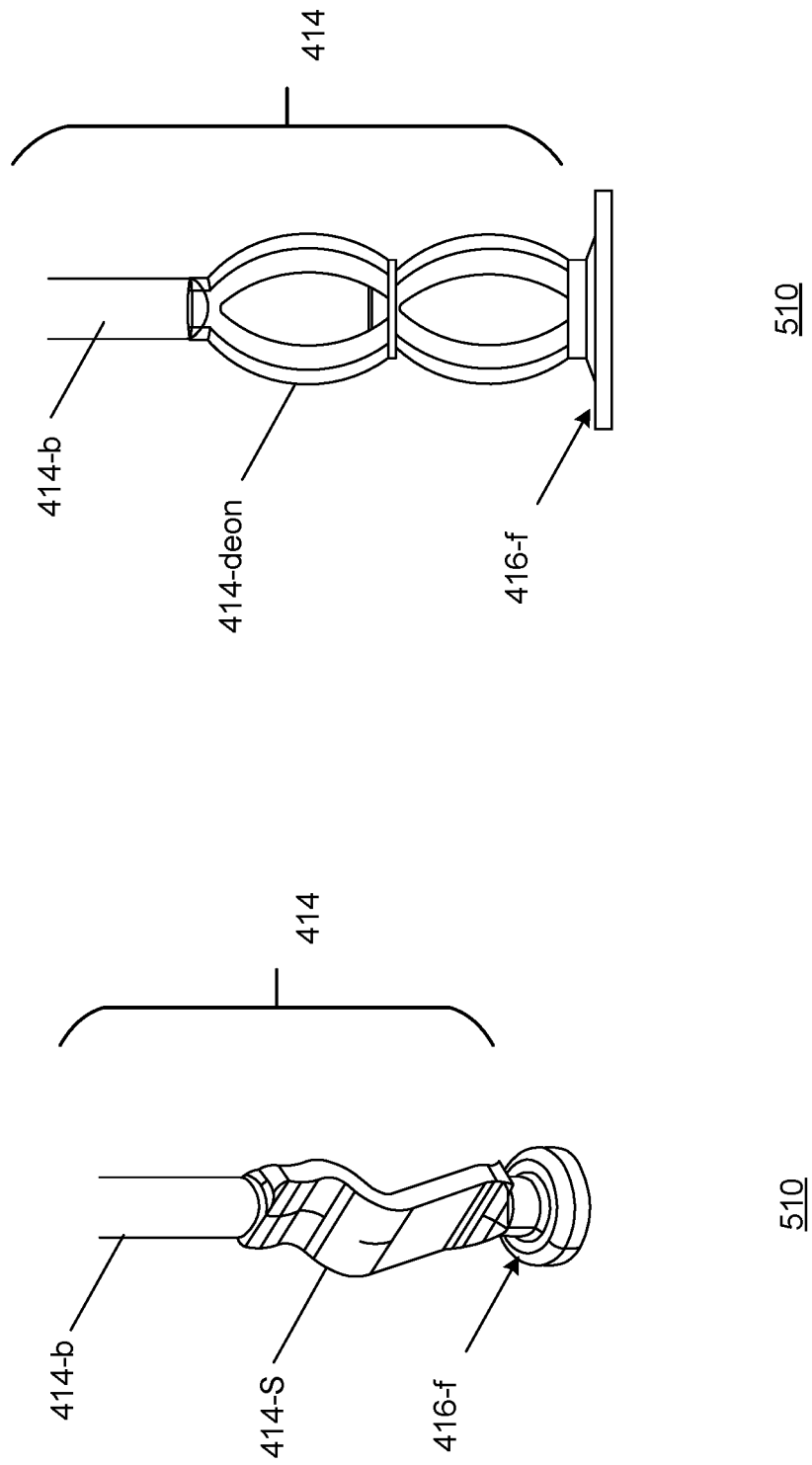

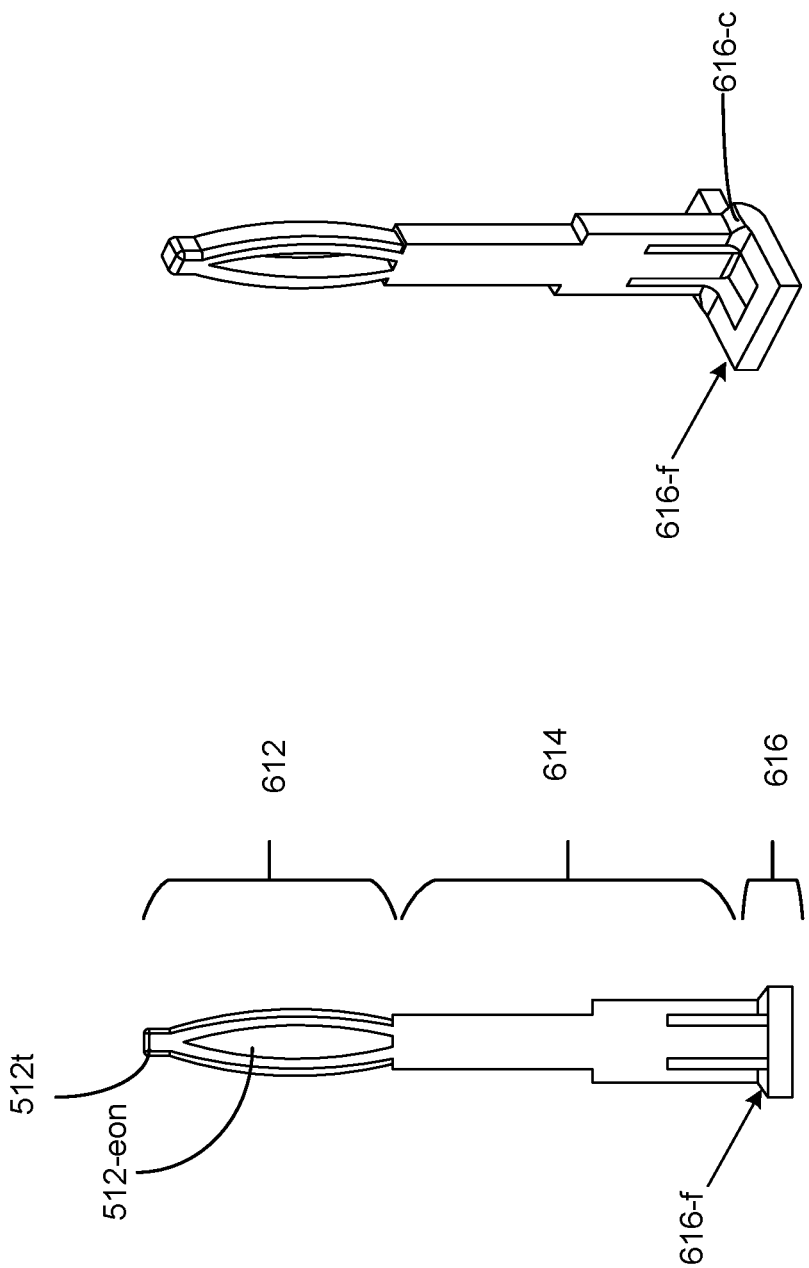

BONDING MODULE PINS TO AN ELECTRONIC SUBSTRATE

TECHNICAL FIELD

This description relates to power device module packages.

BACKGROUND

It may be desirable in some applications to engineer and manufacture power devices to provide sufficient performance, cost, and reliability. A semiconductor power device can be often manufactured discretely as opposed to being integrated in an integrated circuit (IC) process. Typically, the power device die is mounted on a printed circuit board to form a circuit, and enclosed in a power module package. Packaging technologies for a power module package can include lead frame, die attach, electrical interconnections, and encapsulation. Power module pins attached to the printed circuit board extending through the power module package can form the external electrical connections (e.g., power supply, signal, and ground leads (terminals)) to the enclosed circuit.

The semiconductor packaging technologies can only degrade the performance of a power device and circuit by adding thermal and electrical resistance, inductance, size, cost, and reliability problems. Thus, a need exists for systems, methods, and apparatus to address the shortfalls of present technology and to provide other new and innovative features.

SUMMARY

A method includes disposing a terminal pin on an electronic substrate with a base region of the terminal pin in contact with a circuit trace on the electronic substrate, and ultrasonically coupling the base region of the terminal pin to the circuit trace.

In an aspect, disposing the terminal pin on the electronic substrate includes picking up the terminal pin from a rack using a sonotrode probe, and moving the picked-up terminal pin to a location on the electronic substrate in a pick-and-place operation. The terminal pin has at least one compressible shape feature, and picking up the terminal pin from the rack includes press-fitting the terminal pin in a lumen in the sonotrode probe by compressing the at least one compressible shape feature. The at least one compressible shape feature may include at least one of a groove-and-ridge section disposed in the body region of the terminal pin, an eye-of-needle structure disposed in the tip region of the terminal pin, and a chamfer transitioning from the body region to a flange in the base region of the terminal pin.

In an aspect, directing ultrasonic energy to the base region of the terminal pin in contact with the circuit trace includes using the sonotrode to direct ultrasonic waves to the base region in contact with the circuit trace.

BRIEF DESCRIPTION OF THE DRAWINGS

FIGS. 5A through 5D illustrate views of another terminal pin.

FIG. 6A and FIG. 6B illustrate views of yet another terminal pin.

DESCRIPTION

Figure 1A:
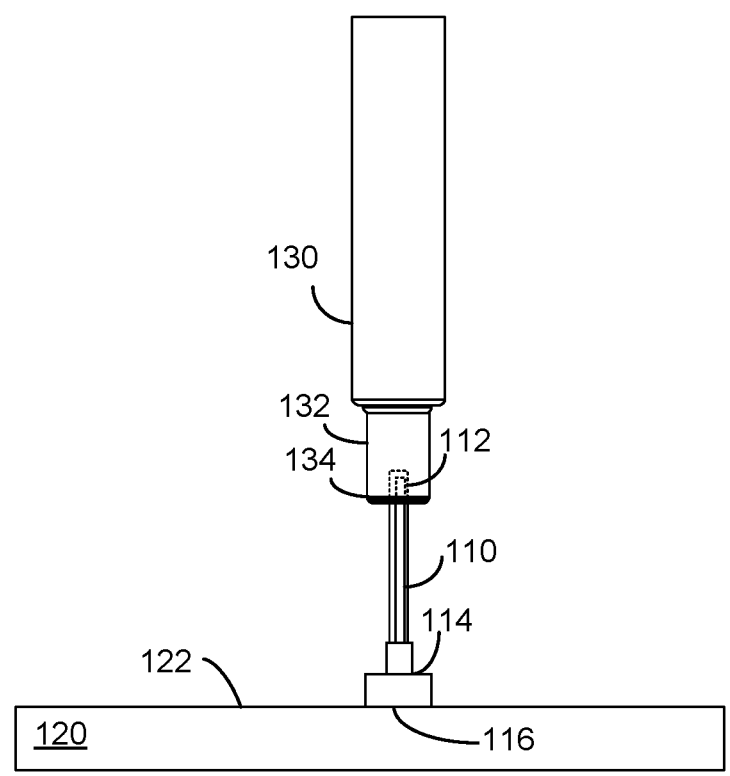
FIGS. 1A through 1D illustrate ultrasonic welding of a terminal pin to a metal pad.

In some implementations, the modules and packages described herein include high power devices that are assembled together into a single package. For example, the packages can include multiple semiconductor die (e.g., silicon semiconductor die, silicon carbide (SiC) semiconductor die, insulated-gate bipolar transistors (IGBTs), metal-oxide-semiconductor field effect transistor (MOSFET) die, etc.) that may be assembled together to provide high performance, reliability, and/or improvement in thermal management while maintaining proper electrical performance of the submodule or package.

In some implementations, the packages described herein can be used in applications with high voltages (e.g., higher than 600 V), high current densities (e.g., between 100 A to 800 A (e.g., 400 A)), and/or high switching frequencies (e.g., greater than 1 kHz). In some implementations, the packages can be used in a variety of applications including, for example, automotive applications (e.g., automotive high power module (AHPM), electrical vehicles, and hybrid electrical vehicles), computer applications, industrial equipment, traction invertors, on-board charging applications, inverter applications, and/or so forth. In some implementations, one or more of the semiconductor die described herein can include, or can be, at least a portion of an automotive high power module (AHPM) power device.

Inverters for industrial applications (e.g., automotive inverters) can incorporate a wide variety of components, including insulated-gate bipolar transistor (IGBT) power devices, fast recovery diodes (FRDs), high-voltage DC line capacitors, main circuit bus bars, a power module drive circuit board, a motor control circuit board, three-phase current sensors, and DC and heavy-current AC connectors, etc.

Terminal pins are useful connectors for devices mounted on, and circuits formed on, electronic substrates. An electronic substrate, for example, can be a printed circuit board with circuit trace(s) (e.g., a metal or copper traces), can be a direct bonded metal (DBM) substrate (e.g., direct-bonded copper (DBC)) having circuit trace(s) formed (e.g., printed) on a side (or both sides), and/or so forth. Circuit components (semiconductor device die, resistive elements, capacitors, inductors, interconnections, terminal pins etc.) may be disposed on the circuit trace(s) to form an electronic circuit.

In example power modules or packages, the electronic substrates may be enclosed in a housing or casing (e.g., a plastic cover or molding). The terminal pins may be attached to pads on the electronic substrate and extend through the housing or casing to form external electrical interconnections (e.g., power, signal or ground terminals) of the power modules or packages. The terminal pins may be made of, for example, copper, nickel, aluminum, or other metals or metallic alloys. The terminal pins may be plated with, for example, silver, palladium, nickel or gold.

In packaging technologies, the terminal pins are attached to pads on the electronic substrate before packaging, for example, using soldering techniques. The soldering techniques may involve using solder alloy as adhesive material and heating for solder reflow (to bind pins to the pads on the electronic substrate). A pin may have a flat face that may be soldered, for example, to a copper track of the electronic substrate. The other end of the pin may be available for making a connection terminal outside of the package (after packaging).

The soldering techniques for attaching pins to the electronic substrate may involve reheating and cooling cycles (e.g., during pin attachment solder reflow process). The reheating and cooling cycles can degrade interfaces of other components (e.g., die attach interface) already attached to the electronic substrate. Further, solder intermetallic growth can pose reliability problems.

The present disclosure describes, systems and methods using ultrasonic bonding (e.g., welding) to attach terminal pins to an electronic substrate or an electronic substrate.

A terminal pin may have a rod-like or needle-like shape extending from a pin tip region to a base region (e.g., a base with a substantially flat face). For ultrasonic bonding, the terminal pin may be placed on a portion (e.g., a metal pad) of the circuit trace with the flat face of the base in contact with the metal pad. A tool, for example, an ultrasonic sonotrode (also known as ultrasonic tip, probe, horn or finger), may direct ultrasonic energy (waves) to the base region of the pin with the flat face of the base in contact with the metal pad. The applied ultrasonic energy may ultrasonically bond (e.g., weld) the terminal pin to the electronic substrate (e.g., DBM substrate) along the flat face of the base in contact with the metal pad.

In some implementations, the sonotrode may be configured to apply ultrasonic energy by directing longitudinal ultrasound waves to the base region of the pin with the flat face of the base in contact with the metal pad. The longitudinal ultrasound waves may be generated, for example, by longitudinal movements of ultrasound transducers in the sonotrode along a vertical axis. A speed or vibrational frequency of the longitudinal movements of ultrasound transducers movements of ultrasound transducers may be of the order of several kHz (e.g., in the range of about 20 kHz to 80 kHz).

In some implementations, the sonotrode may configured to apply ultrasound energy by directing torsional ultrasound waves (i.e., tangential vibrations) to the base region of the pin with the flat face of the base in contact with the metal pad. The torsional ultrasound waves may be generated, for example, by rotational or twisting movements of ultrasound transducers in the sonotrode about the vertical axis. A speed or vibrational frequency of the rotational or twisting movements of ultrasound transducers may be of the order of several kHz (e.g., in the range of about 20 kHz to 80 kHz).

FIGS. 1A through 1D show, for example, ultrasonic welding of a needle-like terminal pin 110 placed on a metal pad 120 using a sonotrode 130.

Terminal pin 110 may have a pin tip region 112 and a base region 114. Base region 114 (also can be referred to as head region) may have a with a substantially flat surface 116. Terminal pin 110 may be disposed (e.g., disposed vertically, disposed substantially vertically) so that substantially flat surface 116 of base region 114 is in contact with a surface 122 of metal pad 120.

Sonotrode 130 may include a hollow probe 132 having a probe tip or edge 134. Hollow probe 132 may have a tubular structure with a lumen extending inward from probe tip or edge 134. Sonotrode 130 may aligned to receive terminal pin 110 in hollow probe 132. For ultrasonically welding terminal pin 110 to metal pad 120, sonotrode 130 may be lowered over terminal pin 110 so that probe edge 134 is close to base region 114 in contact with metal pad 120.

Figure 1B:
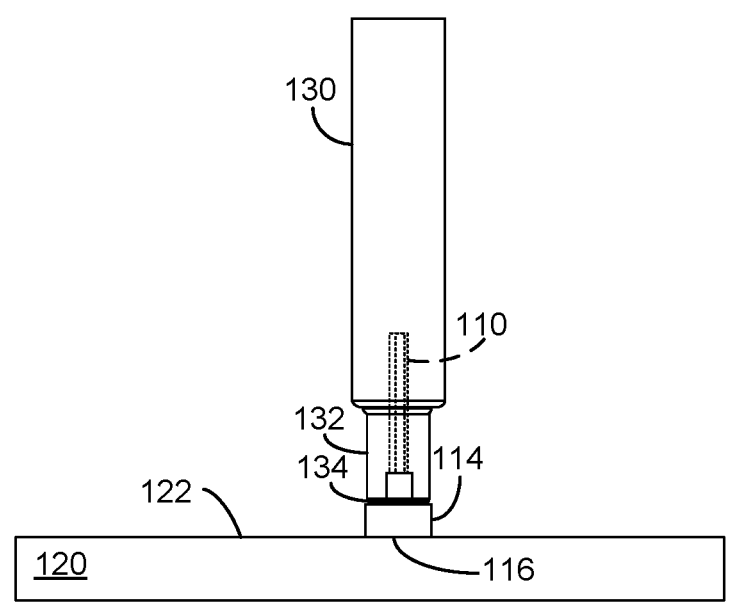
Figure 1C:
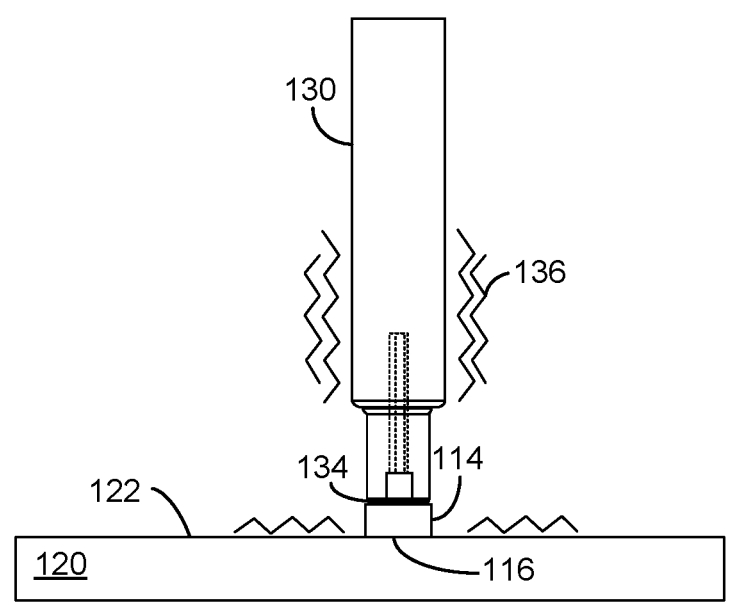
Figure 1D:
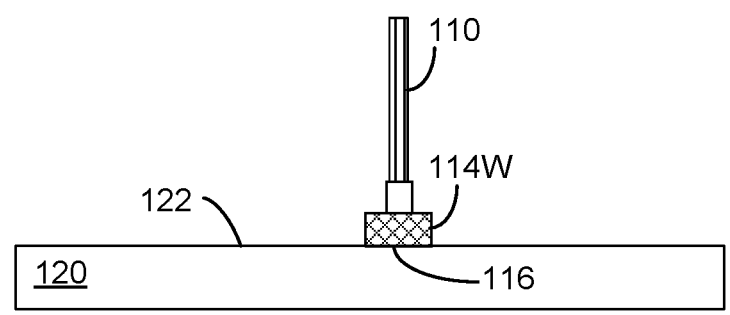

FIG. 1A shows, for example, pin tip region 112 of terminal pin 110 introduced in hollow probe 132. FIG. 1B shows, for example, sonotrode 130 lowered over terminal pin 110 so that edge 134 is close to base region 114 in contact with metal pad 120. In this position, as shown in FIG. 1C, sonotrode 130 may be activated to direct ultrasonic waves (e.g., longitudinal ultrasonic waves 136 and/or torsional ultrasonic waves 137) to base region 114 in contact with metal pad 120. In example implementations, the ultrasonic waves (e.g., longitudinal ultrasonic waves 136 and/or torsional ultrasonic waves 137) may have a frequency, for example, in the range of about from 20 kHz to 80 kHz, and a small amplitude of vibration (e.g., about 13 to 130 micrometers). The ultrasonic waves (e.g., longitudinal ultrasonic waves 136 and/or torsional ultrasonic waves 137) may give energy directly to a welding contact area (e.g., surface 116), with little diffraction. In response to the high frequency and the amplitude of the ultrasonic waves, a resulting friction along surface 116 may bind (weld) base region 114 to metal pad 120. FIG. 1D illustrates terminal pin 110 with base region 114 welded to metal pad 120 (as base region 114W) after repositioning of the sonotrode.

Figure 2:
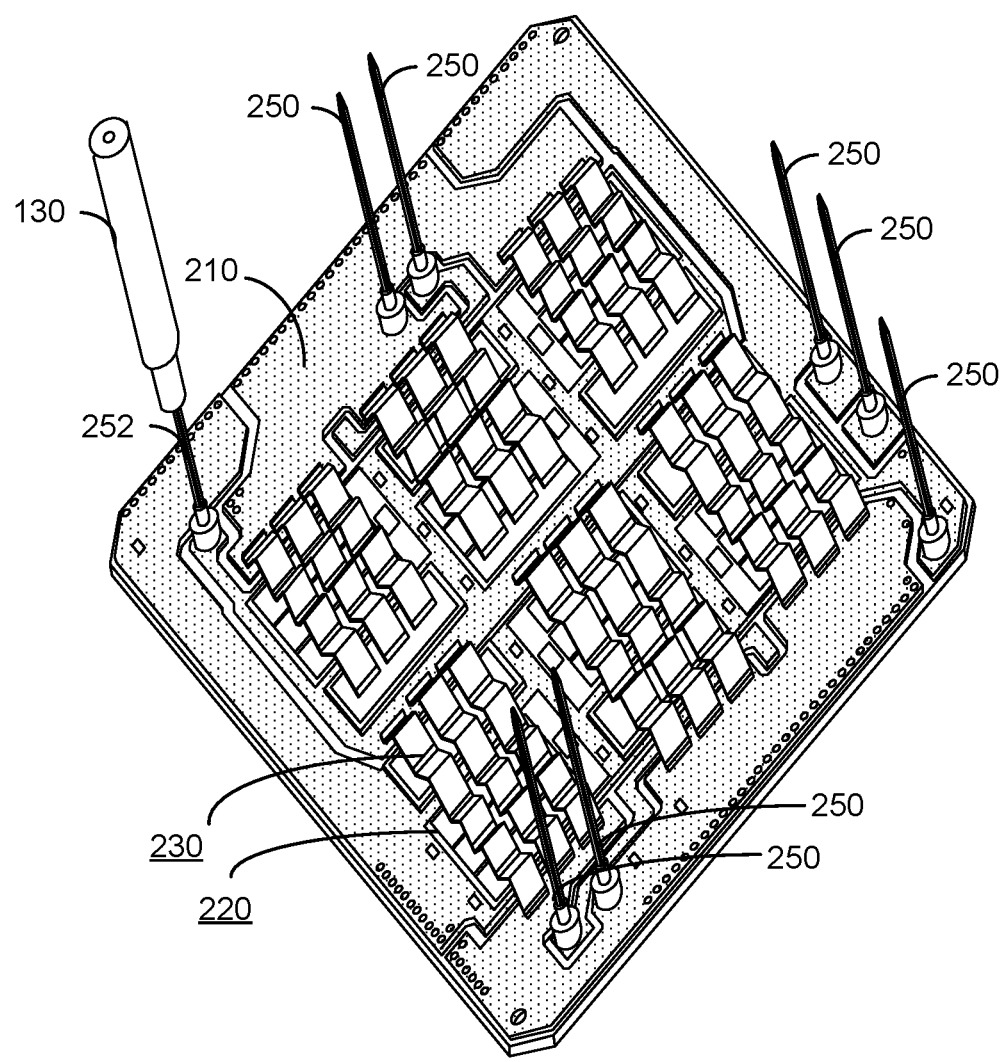
FIG. 2 illustrates an electronic substrate with a printed circuit trace.

In example implementations, terminal pins (e.g., terminal pin 120) may be coupled (e.g., welded), in situ, on a, for example, an electronic substrate that already has several mounted circuit components (semiconductor device die, resistive elements, capacitors, inductors, interconnections, other terminal pins, etc.). FIG. 2 shows for example, an electronic substrate 200 with a printed circuit trace 210. Several circuit components (e.g., die 220, interconnections 230, etc.) of a circuit (e.g., a power circuit) may be disposed on circuit trace 210. Terminal pins 250 may be ultrasonically welded or bonded to circuit trace 210, in situ, using, for example, sonotrode 130. FIG. 2 shows, for example, a terminal pin 252 in a process of being ultrasonically welded or bonded to circuit trace 210 using sonotrode 130.

In example implementations, a system for ultrasonically welding terminal pins to an electronic circuit trace on an electronic substrate may include a sonotrode coupled to an x-y-z placement tool.

Figure 3:
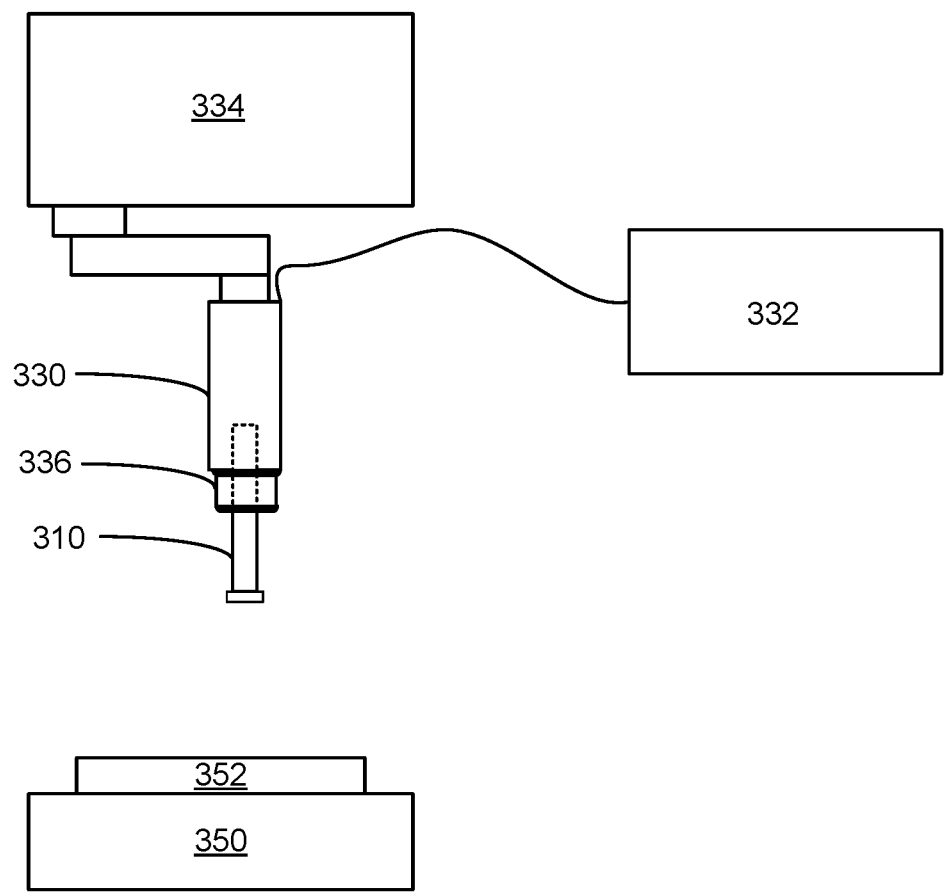
FIG. 3 is a schematic illustration of an example system for ultrasonically welding terminal pins on an electronic substrate.

FIG. 3 schematically shows an example system 300 for ultrasonically welding terminal pins (e.g., terminal pin 310) to an electronic circuit trace on an electronic substrate. System 300 may include a stage 350 (e.g., an XY stage) for holding the electronic substrate 352, and a sonotrode 330 powered by ultrasonic power generator 332. Hollow probe tip 334 of sonotrode 330 may include locking mechanisms (e.g., a chuck, a pressure-fit) (not shown) for automatically holding and releasing terminal pin 310. Sonotrode 330 may be coupled to a motorized three-dimensional (3D) positioner 334 (e.g., an XYZ positioner configured to move the sonotrode 330 probe along X, Y, Z axes). Three-dimensional positioner 334 may include a position detector (e.g., a camera)(not shown) for detecting positions electronic substrate 352 (held on stage 350). Three-dimensional positioner 334 may be further configured to drive sonotrode 330 to pick-and-place terminal pins onto electronic substrate 352, for welding.

Terminal pins used to form external electrical interconnections (e.g., power, signal or ground terminals) of the power modules or packages may have different shapes, for example, in consideration of the weld characteristics when attached to electronic substrates. Further, the shapes of the terminal pins may be adapted to activate locking mechanisms (e.g., a chuck, press-fit, etc.) to hold the terminal pins in probe tip 336 of sonotrode 330.

FIGS. 4A through 6B show examples of terminal pins having shapes configured in consideration of the weld characteristics when attached to electronic substrates. Further, the terminal pins may have shape features (e.g., locking mechanisms) for holding and releasing the terminal pins in probe tip 336.

Figure 4B:
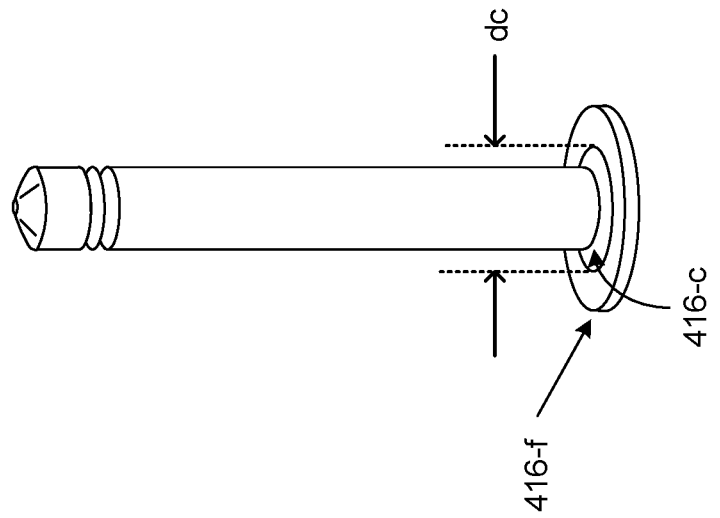
FIGS. 4A through 4C illustrate views of a terminal pin.
Figure 4A:
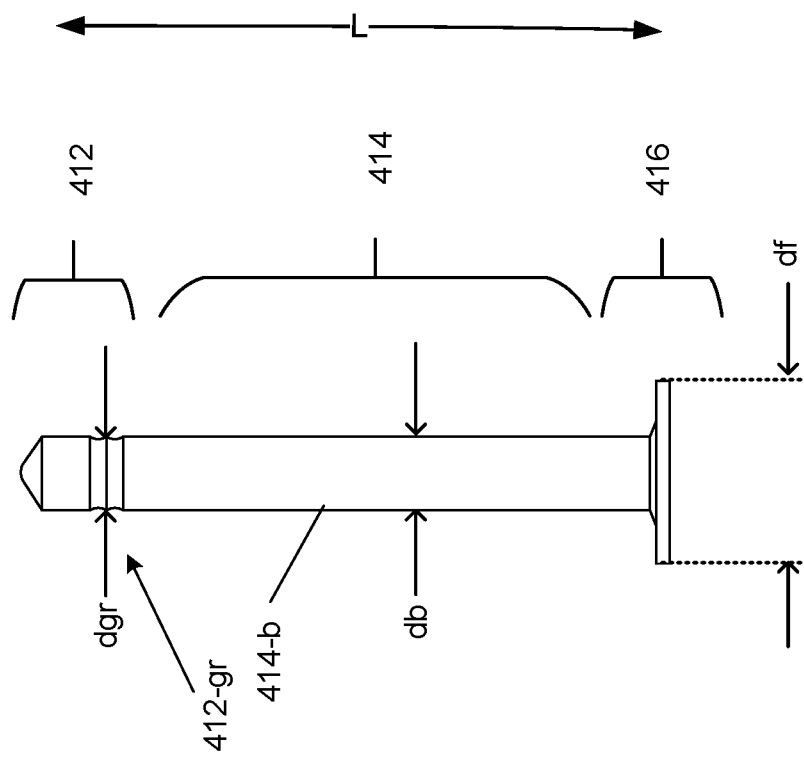

FIG. 4A shows a plan view, and FIG. 4B shows a perspective view, of a terminal pin 410 with a shape adapted in consideration of the welding characteristics when attached to electronic substrates. Terminal pin 410 also includes shape features for fixedly coupling (e.g., press-fitting) in probe tip 336. Although some implementations refer to press-fitting, these implementations can include any type of fixed coupling.

Terminal pin 410 may include a pin tip region 412, a pin body region 414, and a pin base region 416. In example implementations, pin body region 414 may be a rod-like cylindrical body 414-*b* (shank). Cylindrical body 414-*b* may have a diameter d in the range of about a fraction of a millimeter to a few millimeters (e.g., 0.4 mm to 2 mm). Pin tip region 412 may include an extension of the cylindrical body ending in pointed end 412-*t*. The extension of the cylindrical body in the pin tip region below pointed end 412-*t* may include a grooves-and-ridges section (section 412-*gr*) having, for example, one or more circumferential grooves (and ridges). Further, pin base region 416 may include a flat flange 416-*f* capping cylindrical body 414-*b* of pin body region 414. Flange 416-*f* may be shaped like a circular, oval, or rectangular plate. In the example shown in FIGS. 4A and 4B, flange 416-*f* is a flat plate with a circular shape.

A chamfer 416-*c* may be used to transition from the cylindrical body of pin body region 414 to flange 416-*c*. Terminal pin 410 may have a flange-to-tip length L and a body diameter db, chamfer 416-*c* may have a diameter dc, and grooves-and-ridges section may have a diameter dgr. The grooves (or recesses) can have a diameter less than the diameter dgr.

In example implementations, flange 416-*f* may have a diameter df in the range of about a fraction of a millimeter to a few millimeters (e.g., 0.4 mm to 2 mm wide). A diameter of the flange 416-*f* is larger than the diameter dc of the chamfer 416-*c*. The diameter dc of chamfer 416-*c* is larger than the diameter db of the body of the terminal pin 410.

Figure 4C:
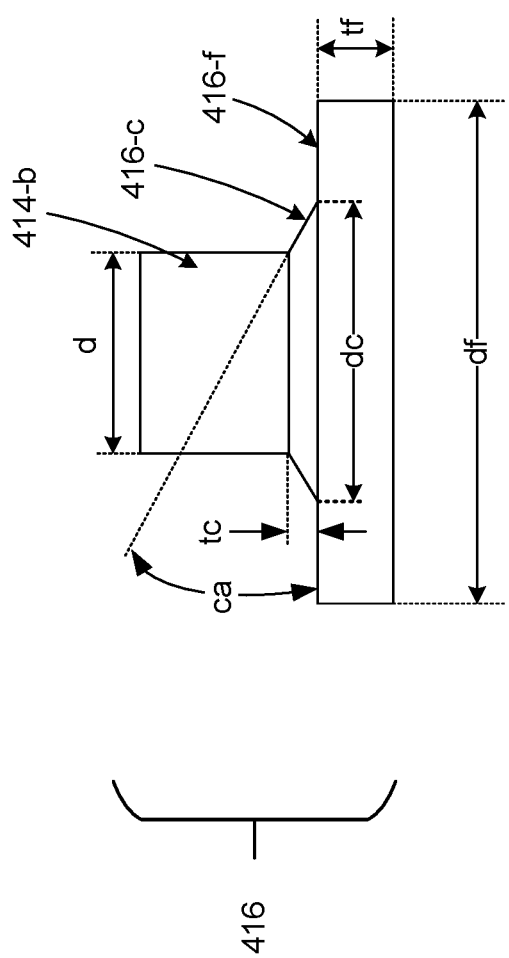

FIG. 4C is an exploded view of base region 416 of terminal pin 410 illustrating an example orientation and example dimensions of chamfer 416-*f*, pin body region 414 and flange 416-*f*. As shown in FIG. 4C, pin body region 414 may include a cylindrical body having a diameter d. Flange 416-*f* may have a diameter df and a thickness tf. The thickness tf is smaller than the diameter df. Chamfer 416-*c* may transition from the cylindrical body to the flange at an angle ca. Chamfer 416-*c* may have a diameter dc (at the flange) and a thickness tc. The thickness tc is smaller than the thickness tf in some implementations. Chamfer 416-*c* may transition from the cylindrical body to the flange at an angle ca.

In example implementations, flange 416-*f* may have a diameter df in the range of about a fraction of a millimeter to a few millimeters (e.g., 0.4 mm to 2 mm). Chamfer 416-*c* may transition from the cylindrical body to the flange at a chamfer angle ca in a range of 20 degrees to 70 degrees. Chamfer 416-*c* may have a diameter dc (at the flange) that is greater than the diameter d of the cylindrical body by about 0.2 mm to 0.6 mm.

The shape features of terminal pin 410 useful for fixedly coupling (e.g., press-fitting) in probe tip 334 may, for example, include grooves-and-ridges 412-*gr* and chamfer 416-*f*.

Figures 5A, 5B:
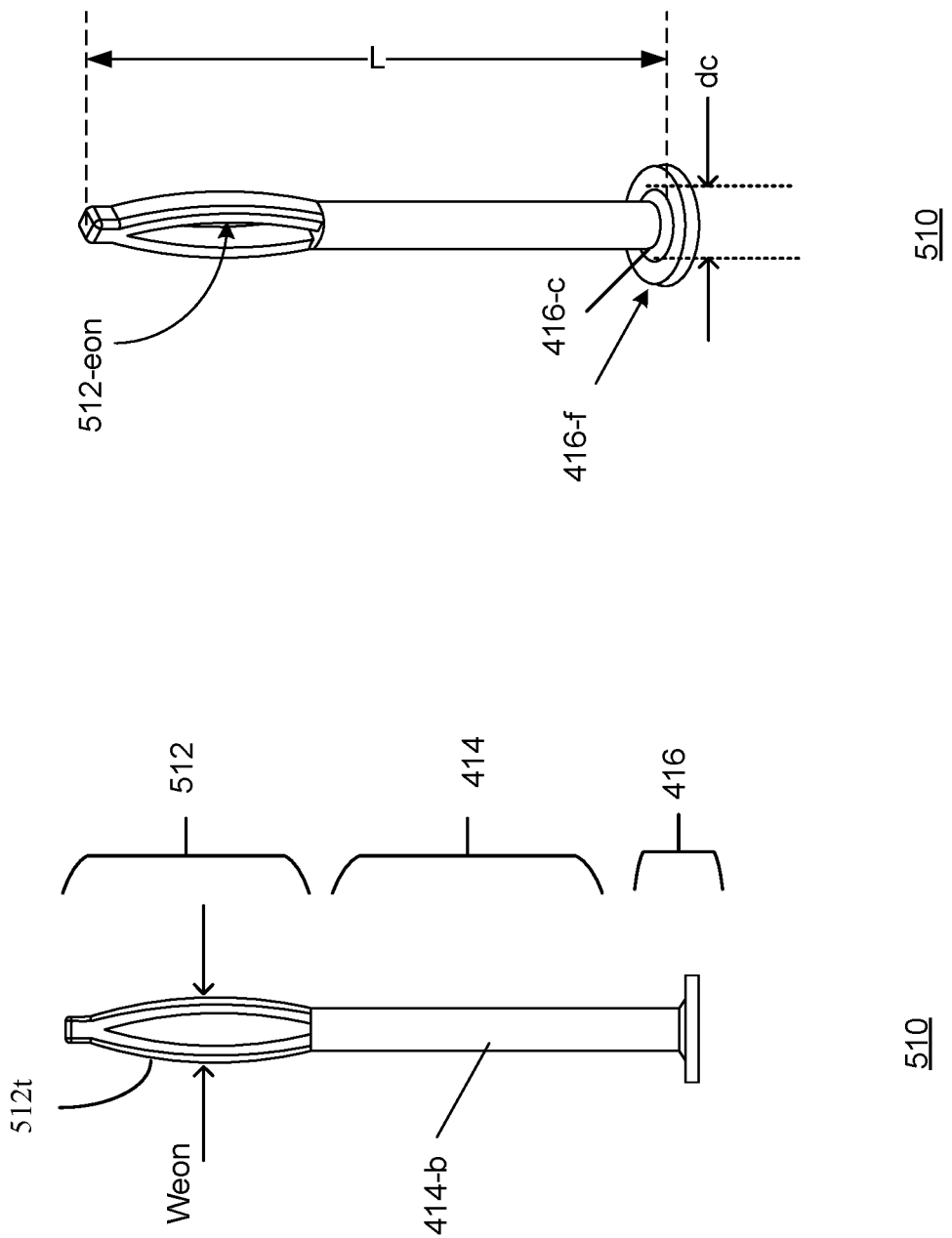

FIG. 5A shows a plan view, and FIG. 5B shows a perspective view, of another terminal pin 510 with a shape adapted in consideration of the welding characteristics when attached to electronic substrates. Terminal pin 510 may have shape features for fixedly coupling (e.g., press-fitting) the terminal pin in probe tip 334. Terminal pin 510, like terminal pin 410, FIGS. 4A-4C) may include a pin body region 414, and a pin base region 416. Pin base region 416 may include a flat flange 416-*f*. A chamfer (e.g., a chamfer 416-*c*) may transition from cylindrical body 414-*b* of pin body region 414 to flange 416-*f*. Terminal pin 510 may further include a pin tip region 512. Pin tip region 512 may have an eye-of-needle structure 512*t*. The eye-of-needle structure 512*t* may be formed by providing a circular or oval hole (eyelet 512-*eon*) in a flattened fish-shaped extension of the cylindrical body of pin body region 414. Eye-of-needle structure 512*t* may have a lateral width Weon at the widest. In example implementations, Weon may be in the range of a fraction of millimeter to a few millimeters (e.g., 0.8 mm to 3 mm wide). Terminal pin 510 may have a flange-to-tip length L, and chamfer 416-*f* may have a diameter dc.

The shape features of terminal pin 510 useful for fixedly coupling (e.g., press-fitting) in probe tip 334 may, for example, include eye-of-needle structure 512*t* and chamfer 416-*f*.

In the example terminal pins (e.g., terminal pins 110, 410, 510, etc.) described in the foregoing, the pin body region (e.g., region 414) has been described as being a rod-like cylindrical body (e.g., cylindrical body 414-*b*). In some example implementations, the pin body region may include structures or regions of non-cylindrical shape (e.g., an S-shaped ribbon structure, a double-eyelet eye-of-needle structure, etc.). FIG. 5C shows, for example, terminal pin 510 in which a portion of pin body region 414 is an S-shape ribbon structure 414-S. FIG. 5D shows, for example, terminal pin 510 in which a portion of pin body region 414 is a double-eyelet eye-of-needle structure 414-*deon*. The shapes and dimensions (not shown) of these non-cylindrical shapes (e.g., S-shaped ribbon structure 414-S, double-eyelet eye-of-needle structure 414-*deon*, etc.) may (like the dimensions of eye-of-needle structure 512*t* and chamfer 416-*f*) be conducive for fixedly coupling (e.g., press-fitting) terminal pin 510 in probe tip 334.

FIG. 6A shows a plan view, and FIG. 6B shows a perspective view, of another terminal pin 610 with a shape adapted in consideration of the weld characteristics when attached to electronic substrates. Terminal pin 610 may have shape features for fixedly coupling (e.g., press-fitting) the terminal pin in probe tip 334. Terminal pin 610 may include a pin tip region 612, a pin body region 614, and a pin base region 616. Pin body region 614 may have a flat ribbon-like structure. Pin tip region 612 (like pin tip region 412, FIGS. 5A and 5B) may have an eye-of-needle structure 512*t*. The eye-of-needle structure may be formed by providing a circular or oval hole (eyelet 512-*eon*) in an extension of the flat ribbon-like structure of pin body region 614. Further, pin base region 616 may include a flat 616-*f* capping the cylindrical body of pin body region 414. Flange 616-f may be shaped like a flat circular, oval, or rectangular plate. In the example shown in FIGS. 6A and 6B, flange 616-f has a flat rectangular shape. A chamfer 616-c disposed on one or more sides (e.g., lateral sides) of the flat ribbon-like body of pin body region 414 may be used to transition from pin body region 614 to flange 616-f.

The shape features of terminal pin 610 useful for fixedly coupling (e.g., press-fitting) in probe tip 334 may, for example, include eye-of-needle structure 512t and chamfer 616-f.

Shape features of terminal pins 410, 510, 610 (e.g., grooves-and-ridges section 412-gr, chamfer 416-f, chamfer 616-f, and eye-of-needle structure 512t, etc.) may be adapted to be fixedly coupled (e.g., press-fit) and hold the pins in a lumen of a probe tip of a sonotrode. The shape features may have a diameter or width larger (slightly larger) than a diameter of the lumen. The shape features may be compressible (e.g., radially compressible). The shape features when compressed may have reduced diameters or widths allowing the terminal pins to be inserted in the lumen of the probe tip with little resistance.

Figure 7A:
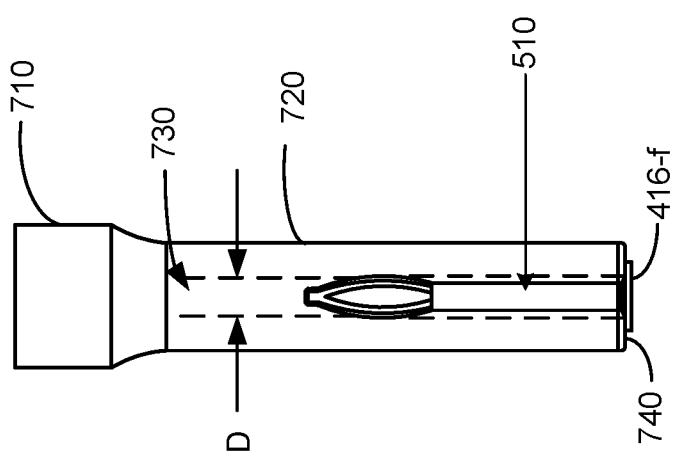
FIGS. 7A through 7C illustrate an example terminal pin fixedly coupled (e.g., press-fitted) in a sonotrode.

FIG. 7A illustrates an example of a terminal pin (e.g., terminal pin 510) fixedly coupled (e.g., press-fitted) in a probe tip 720 of sonotrode 710. Probe tip 720 may include a lumen (e.g., an annular opening 730 of diameter D) extending from end face 740 into sonotrode 710. Annular opening 730 may have an outwardly-sloping bevel surface 740b transitioning to end face 740.

As shown in FIG. 7A, for example, terminal pin 510 may be press-fitted in annular opening 730 with eye-of-needle structure 512t leading into annular opening 730 and flat flange 416-f about flush with end face 740. Eye-of-needle structure 512t may have a lateral width Weon that may be about the same, but slightly wider than diameter D of annular opening 730 (i.e., Weon>D). With Weon slightly larger than D, the length L of terminal pin 510 may be inserted (e.g., press-fitted) longitudinally in annular opening 730 with little resistance (e.g., because of the compressibility eye-of-needle structure 512t). Once inserted, having Weon slightly larger than D may cause eye-of-needle structure 512t to create lateral pressure (e.g., against walls of annular opening 730) to hold terminal pin 510 in place.

When eye-of-needle structure 512t is compressed, the width Weon may be become smaller than D and thus free terminal pin 510 to slide in or out of annular opening 730 with little resistance.

Further, chamfer 416-c may have a diameter dc that may be about the same, but slightly larger than diameter D of annular opening 730 (i.e., dc>D). Further, chamfer angle ca of chamfer 416-c (FIG. 4C) may be about the same a slope angle ba of bevel 740b of annular opening 730.

When the length of terminal pin 510 is inserted in annular opening 730 (with flange 416-f about flush with end face 740), chamfer 416-c (having a diameter slightly larger than diameter D of annular opening 730) may be press fit (e.g., like a bottle cork or stopper) in annular opening 730 to lock inserted terminal pin 510 in position. Surfaces of chamfer 416-c may be pressed in frictional contact with surfaces of bevel 740b with inserted terminal pin 510 locked in position. In example implementations, one or more surface finishes (e.g., rough, granular, or polished, etc.) may be included on end face 740 and/or bevel 740b. In some implementations, the surface finishes on the end face 740 and/or bevel 740b may be included, for example, in consideration of the friction between surfaces of chamfer 416-c and bevel 740b, and the friction between surfaces of flange 416-f and end face 740 when the surfaces are in frictional contact (e.g., when inserted terminal pin 510 is locked in position in annular opening 730). In example implementations, one or more surface finishes (e.g., rough, granular, or polished, etc.) may be included on the flange 416-f and/or chamfer 416-c.

Figure 7B:
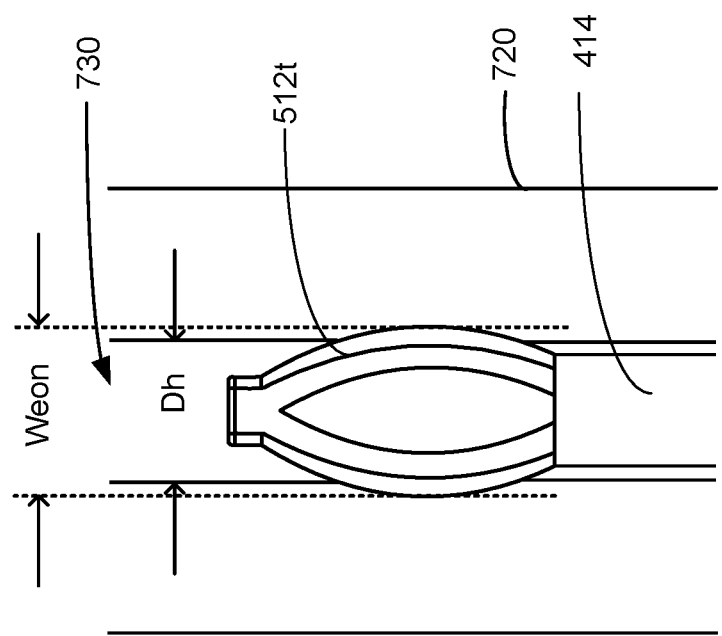

FIG. 7B is an exploded view (of a portion of FIG. 7A) showing a press fit of eye-of-needle structure 512t having a width Weon in annular opening 730 having a diameter Dh (that is slightly smaller than Weon).

Figure 7C:
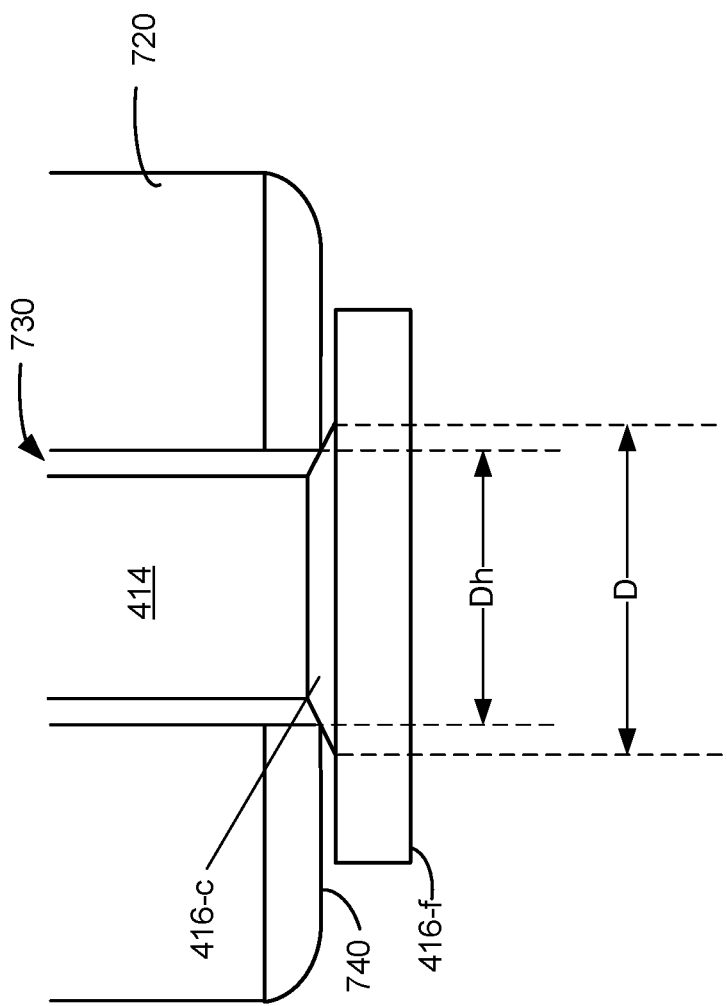

FIG. 7C is an exploded view (of a portion of FIG. 7A) showing a press fit of chamfer 416-c in annular opening 730 of probe tip 720 (with chamfer 416-c having diameter dc that is slightly larger than diameter D of the annular opening).

Figure 8:
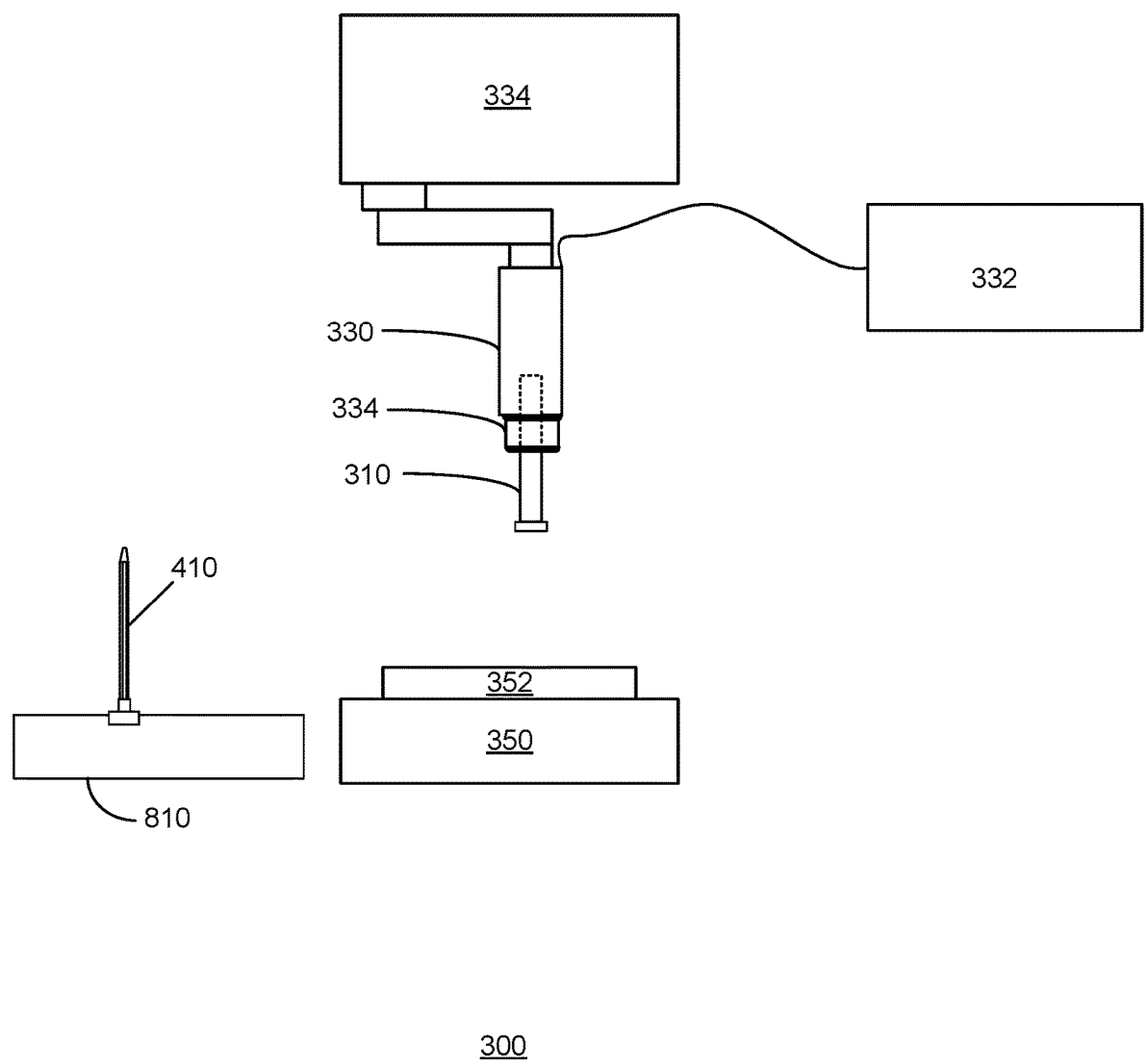
FIG. 8 illustrates a rack of terminal pins associated with the system of FIG. 3.

In example implementations, a process of ultrasonically welding multiple terminal pins to an electronic substrate may be implemented as an automated pick-and-place assembly line process (e.g., in a semiconductor device packaging facility). The automated process may use the locking mechanisms of a sonotrode and the terminal pins (e.g., terminal pins 410, 510 and 610) to pick the terminal pins for placement on the electronic substrate. For example, as shown in FIG. 8, system 300 (FIG. 3) may include a stock of terminal pins (e.g., terminal pins 410) arranged on a stand or rack 810. Motorized XYZ positioner 336 may be configured to move sonotrode 330 in x, y and z directions to pick up a terminal pin (e.g., terminal pin 410) from rack 810, move the picked up terminal 410 to over electronic substrate, and place the picked up terminal on the electronic substrate for ultrasonic welding.

Figure 9:
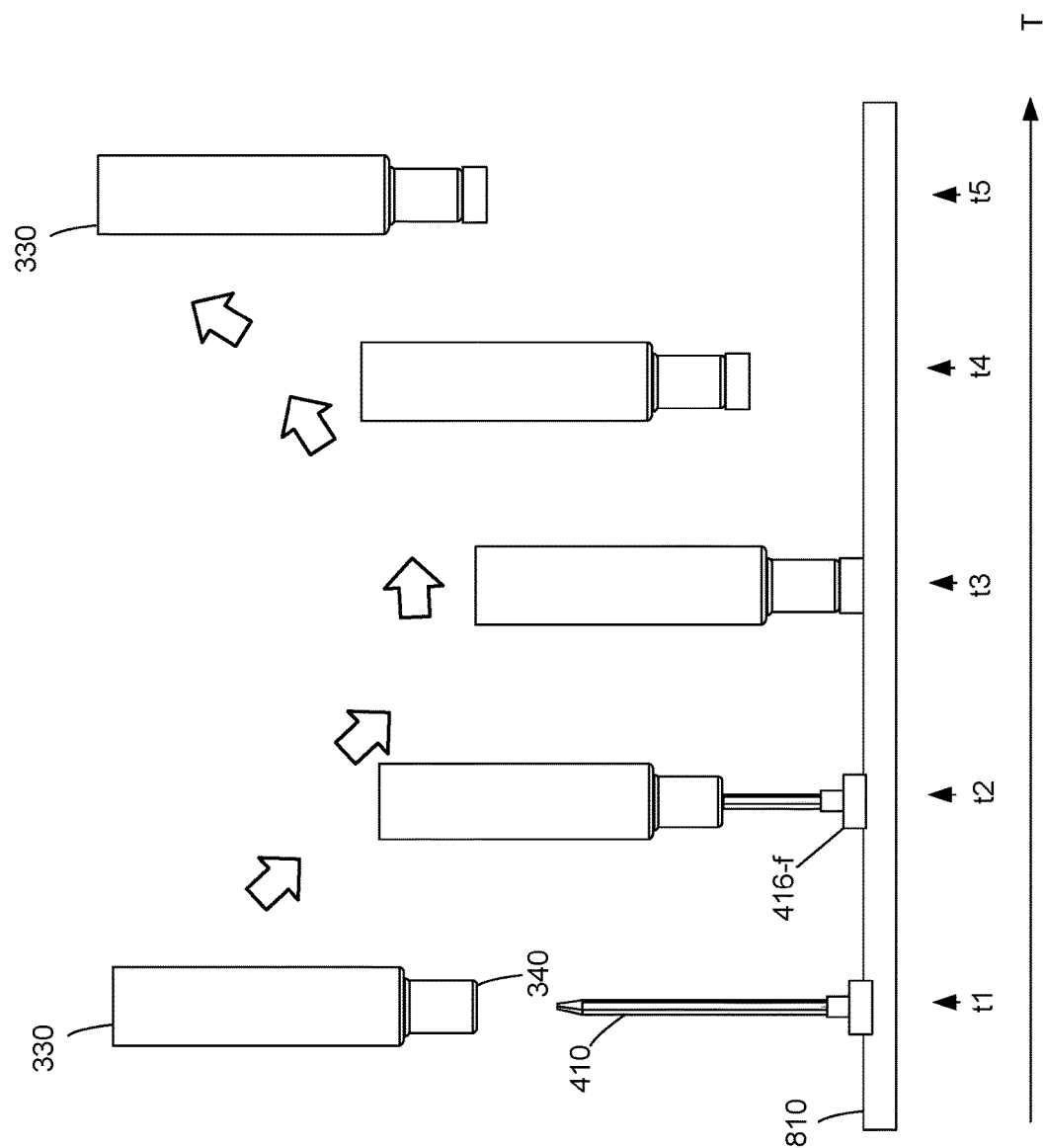
FIG. 9 pictorially illustrates example movement of a sonotrode under control of a three-dimensional positioner.

FIG. 9 pictorially illustrates movement of sonotrode 330 under control of XYZ positioner 336 to pick up terminal pins from rack 810 over a timeline T. At time t1, XYZ positioner 336 may align sonotrode 330 vertically over a terminal pin (e.g., terminal pin 410) on rack 810. At time t2, sonotrode 330 may descend over the terminal pin. At time t3, sonotrode 330 may further descend over the terminal pin to enclose and lock the terminal pin inside sonotrode 330. Flange 416-f may be about flush with end face 340 of the sonotrode. At time t4, sonotrode 330 may ascend vertically to lift enclosed the terminal pin from rack 810. At time t5, sonotrode 330 (including the enclosed terminal pin) may further ascend vertically to position sonotrode for further movement (e.g., position the terminal pin over the electronic substrate to the lift the terminal pin from rack 810.

Sonotrode 330 may pick up a terminal pin (e.g., with a round body using, for example, a vacuum suction system. Pins with either a round body or a flat body (e.g., terminal pins 410, 510 and 610, etc.) may have one or more locking mechanism (e.g., a grooved tip, an eye-of-needle structure, a chamfer, etc.). A pin with a locking mechanism may be picked up by sonotrode 330 after activating the locking mechanism to lock the pin in the sonotrode.

Figure 10:
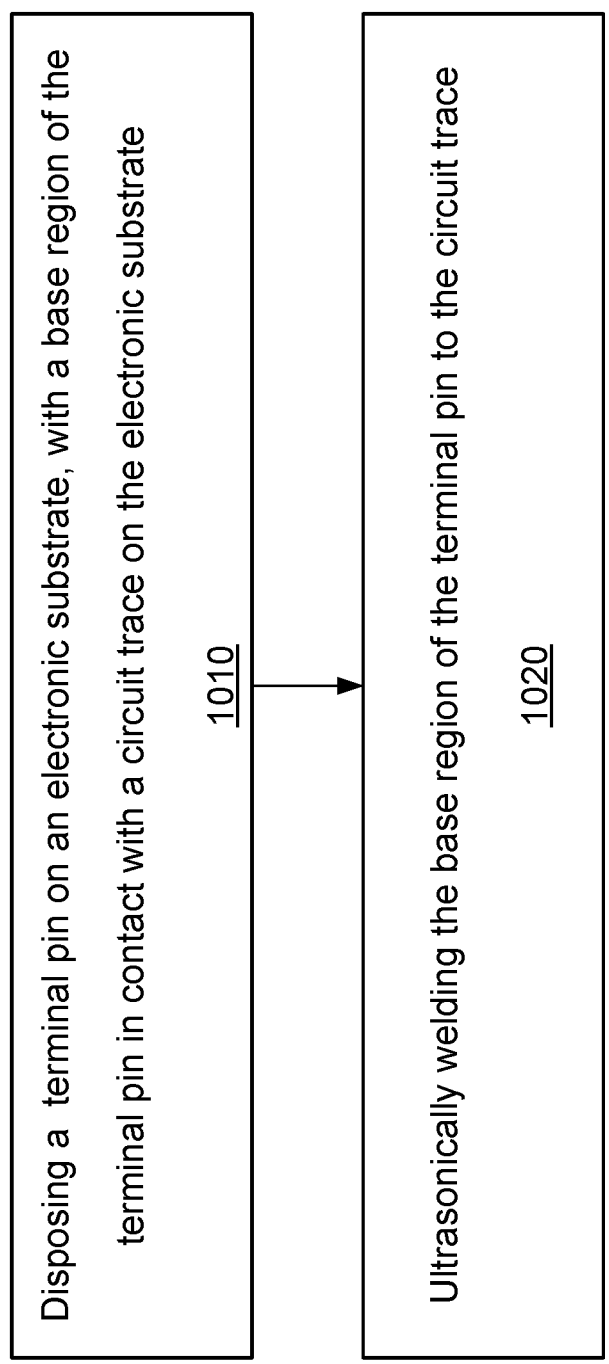
FIG. 10 illustrates an example method for attaching a terminal pin to a circuit trace on an electronic substrate

FIG. 10 illustrates an example method 1000 for attaching a terminal pin to a circuit trace on an electronic substrate. Method 1000 includes disposing the terminal pin on the electronic substrate with a base region of the terminal pin in contact with the circuit trace on the electronic substrate (1010), and ultrasonically 100 welding the base region of the terminal pin to the circuit trace (1020).

In method 1000, the terminal pin (e.g., terminal pin 510) may include a rod-like pin body or shank, and a base region attached to the pin body. The base region may have a flat surface (e.g., surface 116, FIG. 1A). Disposing the terminal pin on the electronic substrate 1001 may include disposing the terminal pin with the flat surface of the base region in contact with the circuit trace on the electronic substrate.

Disposing the terminal pin on the electronic substrate 1001 may further include picking up the terminal pin from a stock or rack, and moving the picked-up terminal pin to a location on the electronic substrate in a pick-and-place operation. Picking up the terminal pin from the stock or rack may include using a sonotrode probe to pick up the terminal pin. A motorized XYZ positioner may move the sonotrode probe with the picked-up terminal to a location on the electronic substrate.

In method 1000, welding the base region of the terminal pin to the circuit trace 1020 may include directing ultrasonic energy to the base region of the terminal pin in contact with the circuit trace. Directing ultrasonic energy to the base region of the terminal pin in contact with the circuit trace may include using a sonotrode to direct ultrasonic waves (e.g., longitudinal ultrasonic waves 136 and/or torsional ultrasonic waves 137) to the base region in contact with the circuit trace. The ultrasonic energy may weld the base region to the circuit trace.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), and/or so forth.

The terminology used herein is for the purpose of describing particular implementations only and is not intended to be limiting of the implementations. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Example implementations of the present inventive concepts are described herein with reference to cross-sectional illustrations that are schematic illustrations of idealized implementations (and intermediate structures) of example implementations. As such, variations from the shapes of the illustrations as a result, for example, of manufacturing techniques and/or tolerances, are to be expected. Thus, example implementations of the present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example implementations.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present implementations.

Unless otherwise defined, all terms (including technical and scientific terms) used herein have the same meaning as commonly understood by one of ordinary skill in the art to which this present inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A terminal pin comprising:
a body region including a body having a length between a first end and a second end and a body width perpendicular to the length, the body being a cylindrical body including at least one shape feature that is compressible in a direction perpendicular to the length of the cylindrical body, the at least one shape feature including at least a groove disposed around the cylindrical body;
a tip region extending from the first end of the body along the length; and
a base region extending from the second end of the body along the length,
the base region including a flange having a flange width that is greater than the body width perpendicular to the length, the flange having a flat surface configured to be placed on a metal pad and configured to receive ultrasound energy to weld the base region to the metal pad,
the terminal pin configured to be received in a lumen of a probe tip of an ultrasonic welding device such that an end face of the probe tip is flush with the flange.

2. The terminal pin of claim 1, wherein the body is disposed in a lumen of a probe tip of an ultrasonic welding device with an end face of the probe tip flush with the flange.

3. The terminal pin of claim 2, wherein the flange is disposed on, and ultrasonically welded to, an electronic substrate.

4. The terminal pin of claim 2, wherein the at least one shape feature includes an eye-of-needle structure disposed in the tip region of the terminal pin.

5. The terminal pin of claim 2, wherein the at least one shape feature includes a chamfer transitioning from the body to the flange in the base region.

6. The terminal pin of claim 2, wherein the body region includes a flat ribbon-like body, and wherein the at least one shape feature includes a chamfer transitioning from at least one lateral side of the flat ribbon-like body to the flange in the base region.

7. The terminal pin of claim 2, wherein the at least one shape feature when compressed has a reduced diameter or width allowing the terminal pin to be inserted in the lumen of the ultrasonic welding device without resistance.

8. The terminal pin of claim 2, wherein the at least one shape feature includes an eye-of-needle structure disposed in the body region of the terminal pin, the eye-of-needle structure having a width greater than a diameter of the lumen of the ultrasonic device.

9. The terminal pin of claim 2, wherein the at least one shape feature includes a chamfer transitioning from the body of the terminal pin to the flange, the chamfer having a diameter greater than a diameter of the lumen of the ultrasonic device.

10. The terminal pin of claim 1, wherein the body region includes a rod-like cylindrical body having a diameter in a range of about 0.4 mm millimeters to 2 millimeters.

11. The terminal pin of claim 10, wherein the tip region includes an extension of the rod-like cylindrical body with a pointed end.

12. The terminal pin of claim 11, wherein the extension of the rod-like cylindrical body in the tip region includes a grooves-and-ridges section having at least one circumferential groove and ridge.

13. The terminal pin of claim 1, wherein the flange is one of a circular plate, an oval plate, or a rectangular plate.

14. The terminal pin of claim 13, wherein the flange is one of the circular plate or the oval plate and has a diameter in a range of about 0.4 millimeters to 2.0 millimeters.

15. The terminal pin of claim 13, wherein a chamfer transitions from the body to the flange at an angle in a range of about 20 degrees to 70 degrees.

16. The terminal pin of claim 15, wherein the chamfer has a diameter at the flange that is greater than a diameter of the body by about 0.2 millimeters to 0.6 millimeters.

17. The terminal pin of claim 1, wherein the tip region includes an eye-of-needle structure formed by providing a circular or oval hole in a flattened extension of a cylindrical body of the body region.

18. The terminal pin of claim 17, wherein the eye-of-needle structure has a lateral width at its widest in a range of about 0.8 millimeters to 3.0 millimeters.

19. The terminal pin of claim 1, wherein the body region includes structures of non-cylindrical shape including at least one of an S-shaped ribbon structure, a flat ribbon-like structure, or a double-eyelet eye-of-needle structure.

20. The terminal pin of claim 19 wherein the tip region includes an eye-of-needle structure formed by providing a circular or oval hole in an extension of a flat ribbon-like structure of the body region.

* * * * *